USO12222475B2

(12) United States Patent
Takashima et al.

(10) Patent No.: US 12,222,475 B2
(45) Date of Patent: Feb. 11, 2025

(54) ROTATIONALLY SHIFT INVARIANT AND MULTI-LAYERED MICROLENS ARRAY

(71) Applicant: Arizona Board of Regents on Behalf of the University of Arizona, Tucson, AZ (US)

(72) Inventors: Yuzuru Takashima, Tucson, AZ (US); Brandon Hellman, Tucson, AZ (US); Joshua Rodriguez, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 989 days.

(21) Appl. No.: 17/049,428

(22) PCT Filed: Apr. 26, 2019

(86) PCT No.: PCT/US2019/029406
§ 371 (c)(1),
(2) Date: Oct. 21, 2020

(87) PCT Pub. No.: WO2019/210208
PCT Pub. Date: Oct. 31, 2019

(65) Prior Publication Data
US 2021/0250481 A1   Aug. 12, 2021

Related U.S. Application Data

(60) Provisional application No. 62/663,610, filed on Apr. 27, 2018.

(51) Int. Cl.
*G02B 13/06* (2006.01)
*G02B 3/00* (2006.01)
(Continued)

(52) U.S. Cl.
CPC .......... *G02B 13/06* (2013.01); *G02B 3/0062* (2013.01); *G02B 19/008* (2013.01);
(Continued)

(58) Field of Classification Search
CPC .... G02B 13/06; G02B 3/0062; G02B 19/008; G02B 19/0085; G02B 3/0056; G02B 17/0856; G02B 13/16
See application file for complete search history.

(56) References Cited

U.S. PATENT DOCUMENTS 5,291,334 A * 3/1994 Wirth .................. G02B 3/0056
359/435
5,351,151 A * 9/1994 Levy .................. G02B 3/0068
359/275
(Continued)

FOREIGN PATENT DOCUMENTS

| CN | 1602421 | 3/2005 |
|---|---|---|
| CN | 1303439 | 3/2007 |

(Continued)

OTHER PUBLICATIONS

Machine translation fof EP1403695 (Year: 2004).*
(Continued)

*Primary Examiner* — Collin X Beatty
(74) *Attorney, Agent, or Firm* — Stuart H. Mayer; Kaplan Breyer Schwarz LLP

(57) ABSTRACT

A rotationally shift invariant and multi-layered array system for full-field of view and/or photon collection by 4 pi steradian field of view. In the system, all of the incoming light (i.e., light from all directions), in a solid angle of 4 pi steradians, is focused inside the optics. The optics have a spherically shift invariant structure, providing rotational shift invariance. The system comprises a nontraditional use of the Gabor Superlen and is a configuration of multiple
(Continued)

microlens array shell structures with concentrically arranged bulk optical components. Examples of such bulk optical components include Luneburg lenses, micro-structured surfaces, a single lens, a plurality of single lenses, ball lenses, metalenses, diffractive optical elements, and magnetic lenses. In an embodiment, the Gabor Superlens (i.e., microlens array) is planar. In an embodiment, no moving parts are required for the system to achieve truly full-field of view imaging and/or photon collection by 4 pi steradian field of view.

17 Claims, 31 Drawing Sheets

(51) Int. Cl.
*G02B 17/08* (2006.01)
*G02B 19/00* (2006.01)
*H01L 27/146* (2006.01)

(52) U.S. Cl.
CPC .... G02B 19/0085 (2013.01); H01L 27/14627 (2013.01); *G02B 3/0056* (2013.01); *G02B 17/0856* (2013.01)

(56) References Cited

U.S. PATENT DOCUMENTS

| | | | | |
|---|---|---|---|---|
| 6,462,795 | B1* | 10/2002 | Clarke | G02B 3/0043 349/95 |
| 8,467,133 | B2 | 6/2013 | Miller | |
| 9,134,534 | B2 | 9/2015 | Border et al. | |
| 9,784,943 | B1 | 10/2017 | Hudyma et al. | |
| 2014/0071226 | A1 | 3/2014 | Satoh et al. | |
| 2018/0017717 | A1* | 1/2018 | Dross | G02B 3/0068 |
| 2018/0097867 | A1* | 4/2018 | Pang | H04N 5/2226 |

FOREIGN PATENT DOCUMENTS

| | | | | |
|---|---|---|---|---|
| CN | 102944934 | A * | 2/2013 | |
| CN | 107209392 | | 9/2017 | |
| CN | 107576395 | | 1/2018 | |
| DE | 102009002189 | | 10/2010 | |
| EP | 1403695 | A1 * | 3/2004 | G02B 3/0056 |
| GB | 2509102 | | 9/2015 | |
| WO | WO-2017212616 | A1 * | 12/2017 | |

OTHER PUBLICATIONS

Machine translation of WO2017212616 (Year: 2017).*
Machine translation of CN102944934 (Year: 2013).*
Shillebeeckx, Ian, et al., "Pose Hashing with Microlens Arrays", IEEE Transactions on Computing, vol. 58, No. 10, Oct. 14, 2016.
Li, Feng, et al., Curved micro lens array for bionic compound eye, Optik 124 (2013) pp. 1346-1349.
Baker, Kenneth M., Highly corrected close-packed microlens arrays and moth-eye structuring on curved surfaces, Applied Optics, vol. 38, No. 2, Jan. 10, 1999, pp. 252-256.
Tremblay, Eric J., et al., Design and scaling of monocentric multiscale imagers, Applied Optics, vol. 51, No. 20, Jul. 10, 2012, pp. 4691-4702.
Liang, Wei-Lun, et al., Wide-angle and ultrathin camera module using a curved hexagonal microlens array and all spherical surfaces, Applied Optics, vol. 53, No. 29, Oct. 10, 2014, pp. H121-H128.
Milojkovic, Predrag, et al., Review of multiscale optical design, Applied Optics, vol. 54, No. 2, Jan. 10, 2015, pp. 171-183.
Luo, Ningning, et al., Fabrication of a curved microlens array using double gray-scale digital maskless lithography, Journal of Micromechanics and Microengineering, 27, 2017, pp. 1-8.
Kim, Yunhee, et al., Viewing-angle-enhanced integral imaging system using a curved lens array, Optics Express, vol. 12, No. 3, Feb. 9, 2004, pp. 421-429.
Li, Lei, et al., Development of a 3D artificial compound eye, Optics Express, vol. 18, No. 17, Aug. 16, 2010, pp. 18125-18137.
Zhang, Hao, et al., Development of a low cost high precision three-layer 3D artificial compound eye, Optics Express, vol. 21, No. 19, Sep. 23, 2013, pp. 22232-22245.
International Search Report and Written Opinion for International Application No. PCT/US2019/029406, dated Jul. 18, 2019.

* cited by examiner

| Radius | Thickness | Material | Semi-Diameter | Conic | Decenter X | Decenter Y |
|---|---|---|---|---|---|---|
| Infinity | Infinity | | Infinity | 0.000 | | |
| 0.412 | 0.137 | N-BK7 | 0.339 U | 0.000 | | |
| 0.458 | 0.107 | | 0.266 U | 1.712 | | |
| 1.291 | 0.050 | N-BK7 | 0.258 U | 0.000 | | |
| -1.965 | 0.096 | | 0.260 U | 0.000 | | |
| -4.040 | 0.182 | N-BK7 | 0.317 U | 0.000 | | |
| -0.414 | 0.310 | | 0.328 U | -0.329 | | |
| Infinity | 0.000 | | 0.000 | 0.000 | 0.000 | -0.350 |
| Infinity | 0.250 | | 0.055 U | 0.000 | | |
| 0.412 V | 0.137 V | N-BK7 | 0.313 U | 0.000 | | |
| 0.458 V | 0.107 V | | 0.206 U | 1.712 V | | |
| 1.291 V | 0.050 V | N-BK7 | 0.270 U | 0.000 | | |
| -1.965 V | 0.098 V | | 0.270 U | 0.000 | | |
| -4.040 V | 0.182 V | N-BK7 | 0.340 U | 0.000 | | |
| -0.414 V | 99.000 | | 0.340 U | -0.329 | | |

FIG. 12

| Radius | Thickness | Material | Semi-Diameter | Conic | Decenter X | Decenter Y |
|---|---|---|---|---|---|---|
| Infinity | Infinity | | Infinity | 0.000 | | |
| Infinity | 2.000 | | 0.863 | 0.000 | | |
| 2.089 | 0.400 | N-SF6 | 0.500 U | -0.488 | | |
| 14.958 | 2.552 | | 0.500 U | 0.000 | | |
| | 1.200 | | 0.000 | 0.000 | 0.000 | 0.300 |
| -0.725 V | 0.200 | N-SF6 | 0.435 U | 0.000 | | |
| -0.469 V | 100.000 | | 0.435 U | -0.335 V | | |

FIG. 17

ROTATIONALLY SHIFT INVARIANT AND MULTI-LAYERED MICROLENS ARRAY

CROSS-REFERENCE TO RELATED APPLICATION

This application is a U.S. National Phase filing of International Application Number PCT/US19/29406 filed Apr. 26, 2019, which relates and claims priority to U.S. Provisional Patent Application Ser. No. 62/663,610, filed on Apr. 27, 2018 and entitled "Rotationally Shift Invariant and Multi-Layered Microlens Array," the entirety of each of which are incorporated herein by reference.

BACKGROUND OF THE INVENTION

1. Field of the Invention

The present disclosure is directed generally to an optical system and, more particularly, to a lens system having a detector therein for full-field of view imaging and/or photo collection.

2. Description of Related Art

Typical cameras (lens+detector) have a tradeoff between field-of-view (FOV) and entrance pupil diameter (EPD). The FOV is inversely proportional to the focal length of the lens, and the focal length is tied to the EPD by the F-Number, where $F/\#=f/EPD$. As the tradeoff exists, there are limits on the manufacturability and availability of lower F/# lenses. For instance, few readily available lenses have a F/# below F/1.2. Since the F/# cannot be much smaller, the focal length, therefore the FOV, and the EPD are connected. This shows the tradeoff between FOV and EPD (signal).

An optical design for truly full-field of view imaging and/or photon collection by 4 pi steradian field of view is known to be impossible. It has traditionally been considered impossible because it was believed that detectors must be placed outside the optics, blocking the incoming light.

Therefore, there is a need for an optical design to provide full-field of view imaging and/or photo collection.

Description of the Related Art Section Disclaimer: To the extent that specific patents/publications/products are discussed above in this Description of the Related Art Section or elsewhere in this disclosure, these discussions should not be taken as an admission that the discussed patents/publications/products are prior art for patent law purposes. For example, some or all of the discussed patents/publications/products may not be sufficiently early in time, may not reflect subject matter developed early enough in time and/or may not be sufficiently enabling so as to amount to prior art for patent law purposes. To the extent that specific patents/publications/products are discussed above in this Description of the Related Art Section and/or throughout the application, the descriptions/disclosures of which are all hereby incorporated by reference into this document in their respective entirety(ies).

SUMMARY OF THE INVENTION

The present invention is a rotationally shift invariant system (RSI) for full-field of view imaging and/or photo collection. According to one aspect, the present invention is a 4-pi light collection system. The system includes a first set of one or more microlens array shell structures having concentrically arranged bulk optical components and a second set of one or more microlens array shell structures having concentrically arranged bulk optical components. The second set of one or more microlens array shell structures is aligned with the first set of one or more microlens array shell structures. The system also includes a light source directed at the one or more microlens array shell structures.

According to another aspect, the present invention is a rotationally shift invariant system. The system includes a first spherical structure of a plurality of microlens arrays and a second spherical structure of a plurality of microlens arrays concentrically within the first spherical structure. The system also includes a detector substantially centrally located within the first spherical structure. A center of curvature of both the first and second spherical structures is at the detector.

According to yet another aspect, the present invention is a method for light collection. The method includes the steps of (i) providing a light collection system having a light source, a first set of one or more microlens array shell structures each having a first focal point, and a second set of one or more microlens array shell structures, wherein the first set and the second set of one or more microlens array shell structures have a pitch offset; and (ii) focusing light from the light source at each of the first focal points.

These and other aspects of the invention will be apparent from and elucidated with reference to the embodiment(s) described hereinafter.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following description taken in conjunction with the accompanying drawings in which:

FIG. 2(*b*) is a diagrammatic representation of rays propagated through a Gabor Superlens;

FIG. 2(*c*) is a diagrammatic representation of rays propagated through a Gabor Superlens;

FIG. 2(*d*) is a diagrammatic representation of rays propagated through a Gabor Superlens;

FIG. 12 is a table with the prescription of a center channel designed for 35° Angle of Incidence, triplet per microlens array;

FIG. 17 is a table with the prescription of a center channel designed for 10° Angle of Incidence, single per microlens array;

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The present invention is a rotational shift invariant system. Rotational shift invariance (RSI) refers to a system which can be rotated for the effect of the same system. It varies from a rotationally symmetric system, such as a lens rotationally symmetric about the optical axis, because the lens must be smooth in the direction of rotation. The RSI system described herein does not need to be continuously shift invariant as long as it is at least discretely shift invariant. For instance, a microlens array (MLA) comprised of lenses on a circumference of a circle will not be rotationally symmetric due to the bumps of the individual lenses. However, if the MLA is rotated about the circle exactly N microlenses around, the system will have the effect of the original MLA. The RSI definition is further stretched to allow regional misalignment, especially for 3D spherical systems, though the overall system remains generally invariant. The following described the processing for generating 2D and 3D RSI systems and the resulting 3D RSI system.

Regarding the 2D designs, segmented symmetry is easy to form in a circle. For instance, 100 microlenses can be equally spaced on a circle by placing a microlens every 3.6 degrees. Expanding the RSI concept to 3D is not simple because it is difficult to equally space points on a sphere. Despite this challenge, the RSI concept can still be applied, as described below.

Figure 1:
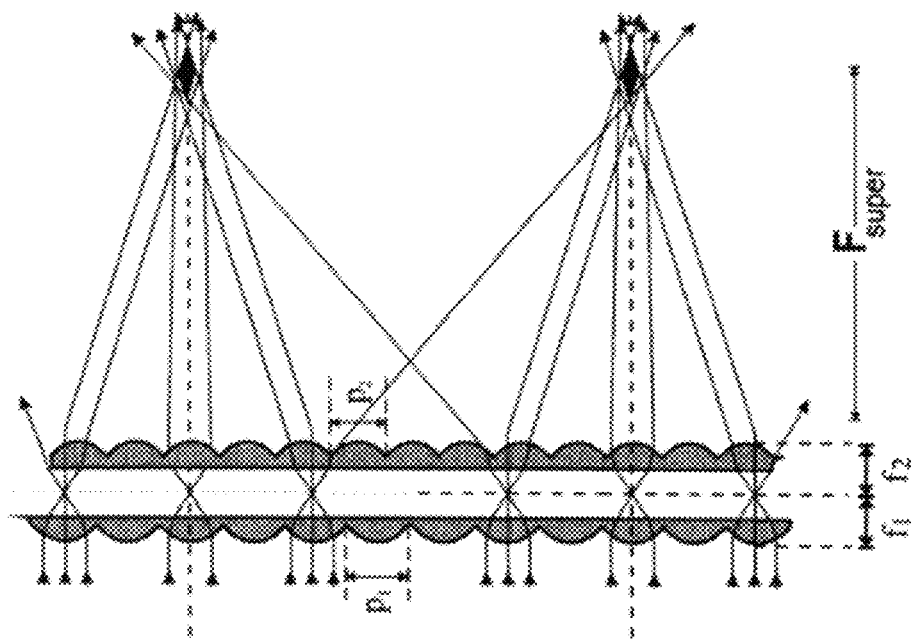
FIG. 1 is a Gabor Superlens of the prior art.

The Gabor Superlens was first described in UK Patent No. GB541753. The flat microlens arrays have focal lengths f1 and f2 and microlens pitches p1 and p2, as shown in FIG. 1. The super focal length is therefore given by $$F = f_2 \frac{p_2}{p_1 - p_2}.$$

The power is given by the offset in pitch. Generally, one microlens is on the same axis as a superfocal point and for every N microlenses (depending on microlens pitch), another lens is on-axis to another superfocal point (FIG. 1 shows two microlenses on-axis with superfocal points).

Figure 2A:
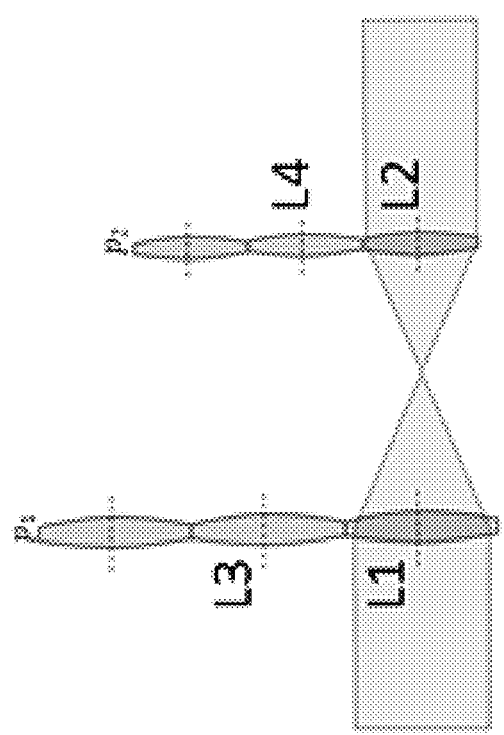
FIG. 2(*a*) is a diagrammatic representation of rays propagated through a Gabor Superlens.
Figure 2B:
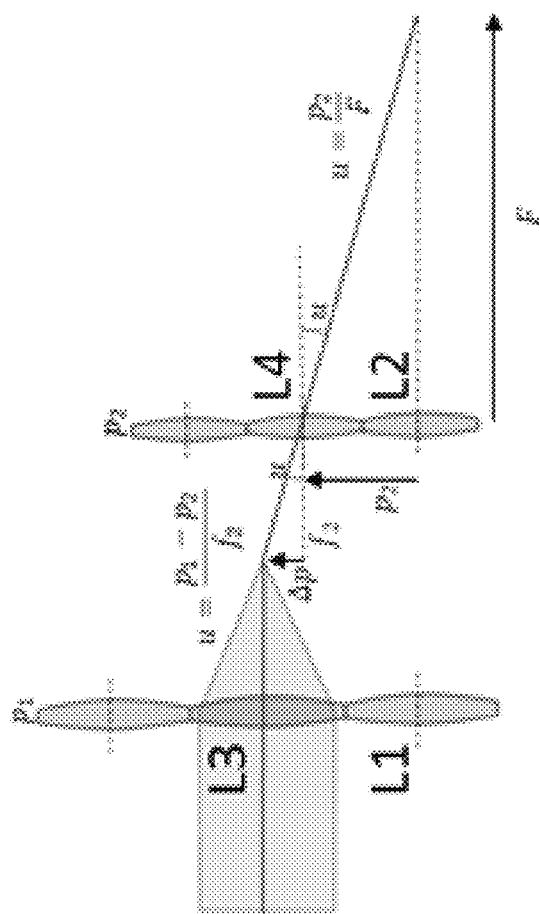
Figure 2C:
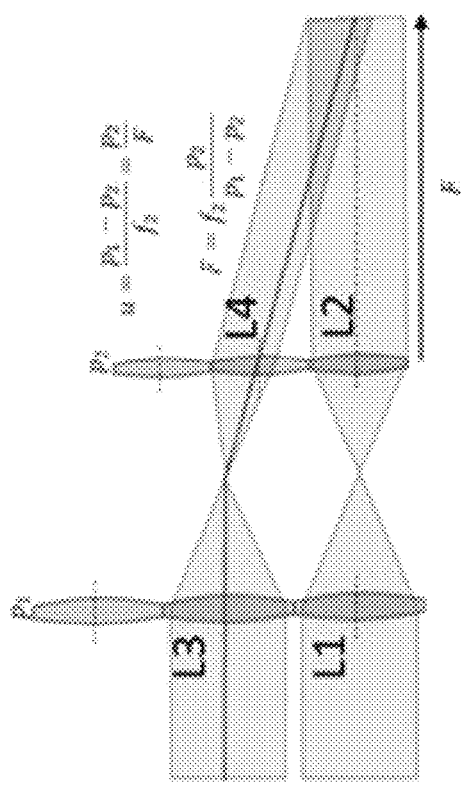
Figure 2D:
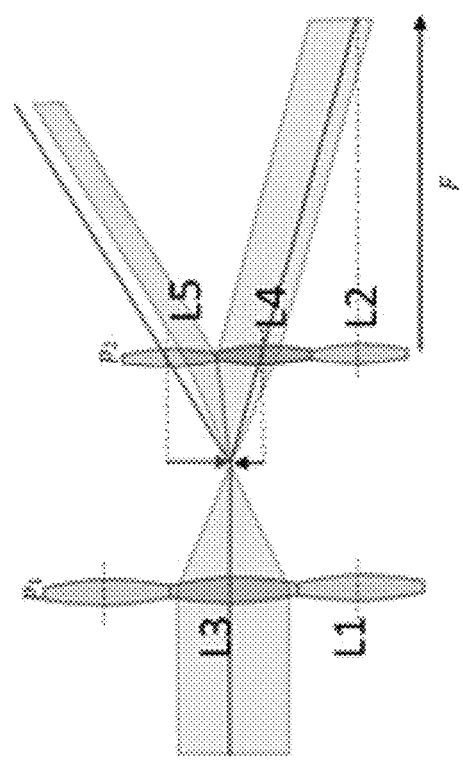

FIGS. 2(a)-2(d) depict light propagation through a traditional Gabor Superlens to create more than one superfocal point. FIG. 2(a) shows the propagation of rays through aligned microlenses L1 and L2, which share an optical axis. FIG. 2(b) shows the propagation of rays through L3, focusing light above the optical axis of L4. FIG. 2(c) shows that L4 collimates the light from L3 and directs it down to the optical axis of L1 and L2. Finally FIG. 2(d) shows the propagation of some rays from L3 to L5 to make a second superfocus point of collimated rays.

Figure 3:
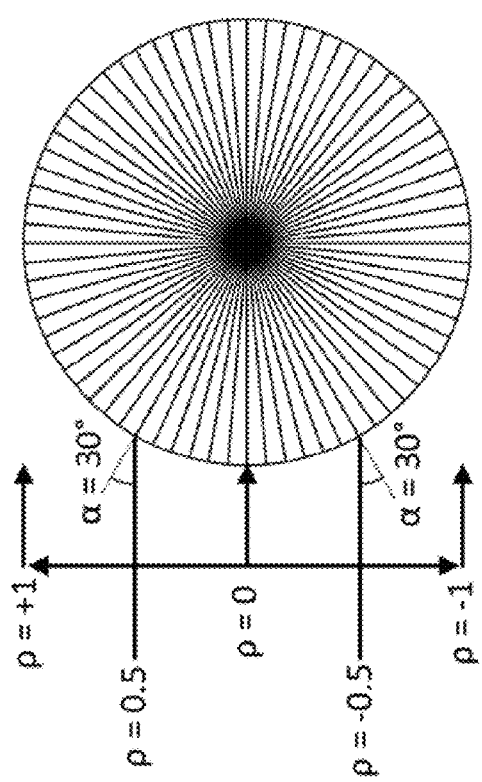
FIG. 3 is a diagrammatic representation of a circle of channels for microlens array positioning.

Turning now to FIG. 3, there is shown a diagram of a circle of channels for microlens array positioning. As shown in FIG. 3, a circle is split into channels of equal angle, similar to a wagon wheel. Each channel can have sub-channels (e.g., by being bisected). Each channel (or sometimes a combination of a few channels or sub-channels) is equivalent across all the channels of the circle (or partial circle). In the example shown in FIG. 3, collimated light comes from the left and the normalized pupil coordinate ρ is shown from −1 to 1. A ray at ρ=0.5 has an angle of incidence α=30°.

Each channel consists of multiple lenses. The lenses are designed for a central off-axis angle. For instance, the lenses of all channels may be designed to redirect light incident on the system at 30° (corresponding to a pupil coordinate of ρ=+/−0.5) directly to the center of the circle. Light close to that angle of incidence, for instance, a range of +/−10° from 30°, will similarly direct light to a focus within the sphere. The effective collection area will therefore be an annulus of 0.34<|ρ|<0.64, or similarly, collecting light incident on the circle at angles between 20° and 40°. These are not hard cutoffs, but rather a range of relatively high throughput to the desired focus. Since the circle is rotationally shift invariant (RSI), the effective collection area is approximately equivalent for light propagating from all directions about the circle.

Several tradeoffs exist in determining the central off-axis angle, which is equivalent to selecting the center of the annulus. For instance, designing the central off-axis angle closer to 0° does not require as high of an F/# of the lens channels, but the superfocus of multiple channels is further from the center of curvature. Alternatively, while designing the central off-axis angle closer to 900 (though typically no higher than 45°) requires higher F/# lens channels, the superfocus of multiple channels is closer to the center of curvature.

Referring now to FIGS. 4-11, there are shown several embodiments for the central channel. The channels above and below the central channel achieve a similar result with different throughput and focusing toward the superfocus point. The main elements for designing each central channel include: (i) bending the rays toward the superfocus using the prism-like wedge of a microlens and (ii) compensating the power of the prism-like wedge microlens with another lens to focus the rays of the channel at a certain distance (e.g., collimated, focusing at a center of curvature, also focusing at the superfocus, etc.). In FIGS. 4-11, the rays are being both bent toward to center of curvature and coming to a focus within a channel at the center of curvature. The bending occurs from optical axis alignment, and the power occurs from focal distance alignment.

Figure 4:
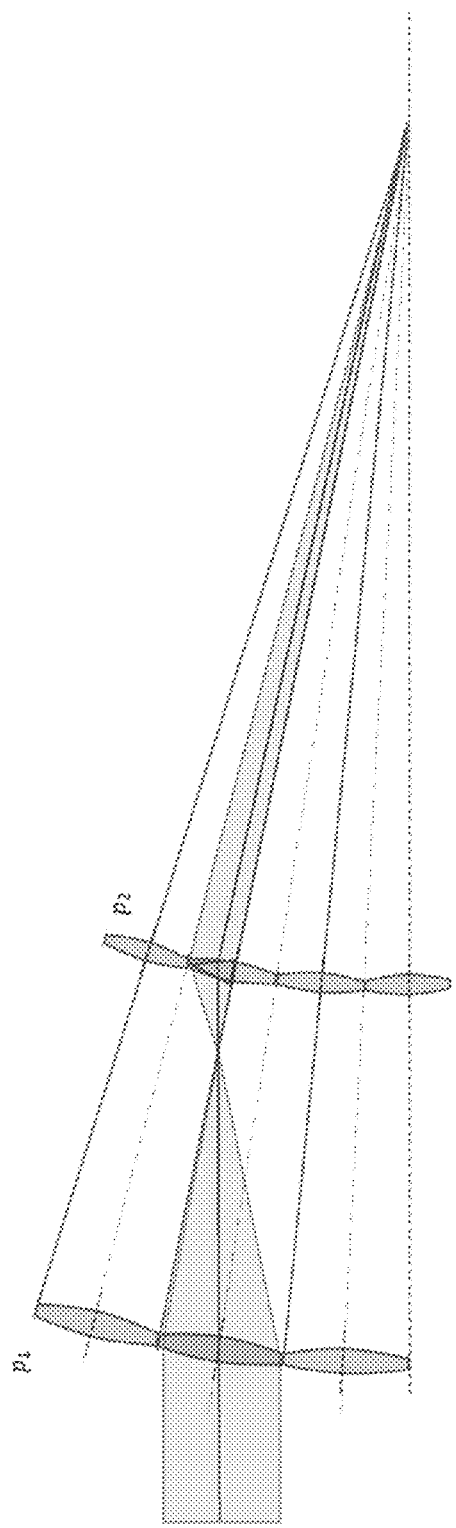
FIG. 4 is a diagram of light incident on first and second microlens arrays, according to a first embodiment.
Figure 5:
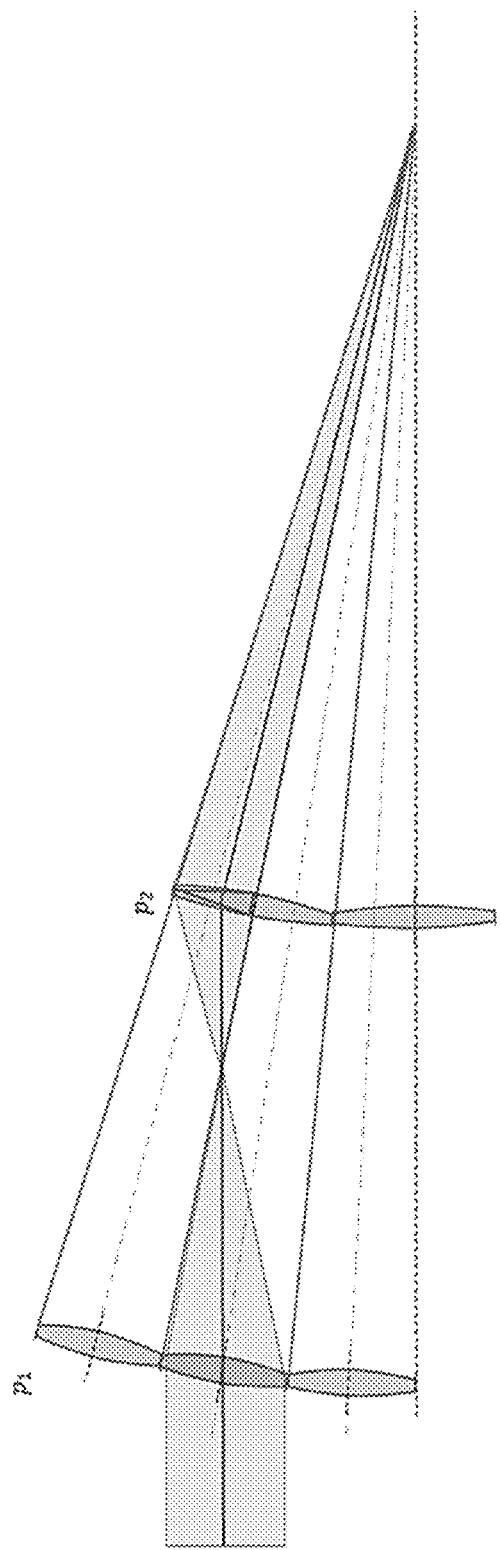
FIG. 5 is a diagram of light incident on first and second microlens arrays, according to a second embodiment.

FIG. 4 shows rays from a first microlens focus on the divider of the same microlens and a neighboring microlens of the same microlens array. The divider is also on the optical axis of a second microlens of a second microlens array, forming a wedge to bend the rays toward the center of curvature. The pitch of both microlens arrays covers the spacing of the channels at their respective distances, so p1>p2. Although similar to FIG. 4, FIG. 5 shows the second microlens placed farther from the intermediate focus, and the pitch of the second microlens array covers two channels.

Figure 6:
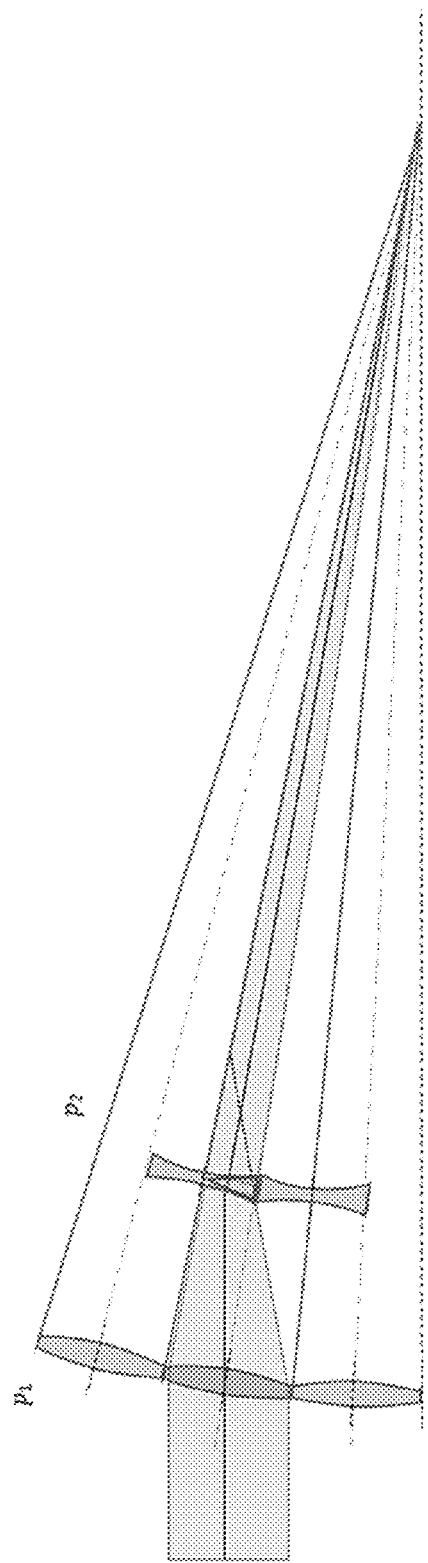
FIG. 6 is a diagram of light incident on first and second microlens arrays, according to a third embodiment.

FIG. 6 also shows a similar central channel design as shown in FIG. 4. However, FIG. 6 shows the second microlens array as a negative element. In order to send light toward the center of curvature, the negative lens is placed before the focus so the back focal point of the first microlens still almost overlaps the front focal point of the second microlens. The embodiment in FIG. 6 returns a negative superfocal distance.

Figure 7:
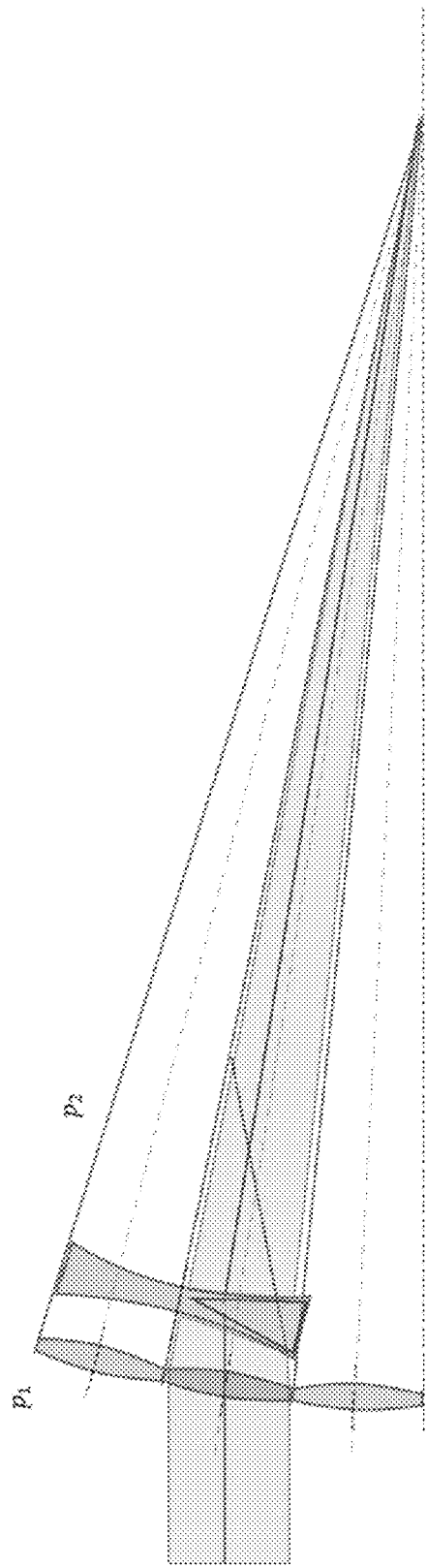
FIG. 7 is a diagram of light incident on first and second microlens arrays, according to a fourth embodiment.
Figure 8:
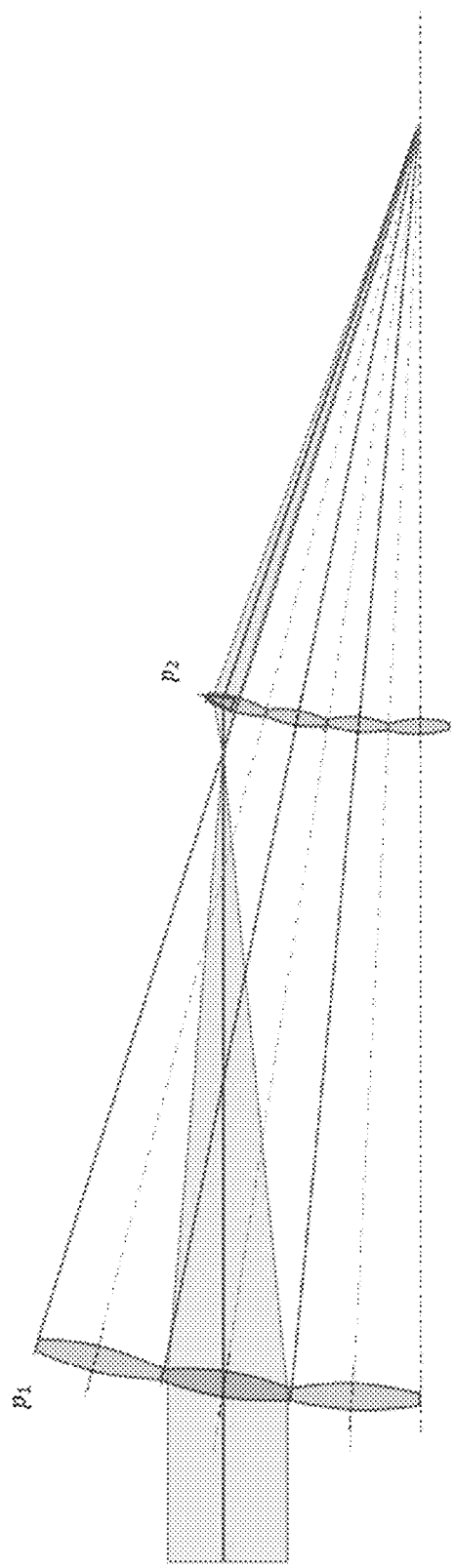
FIG. 8 is a diagram of light incident on first and second microlens arrays, according to a fifth embodiment.
Figure 9:
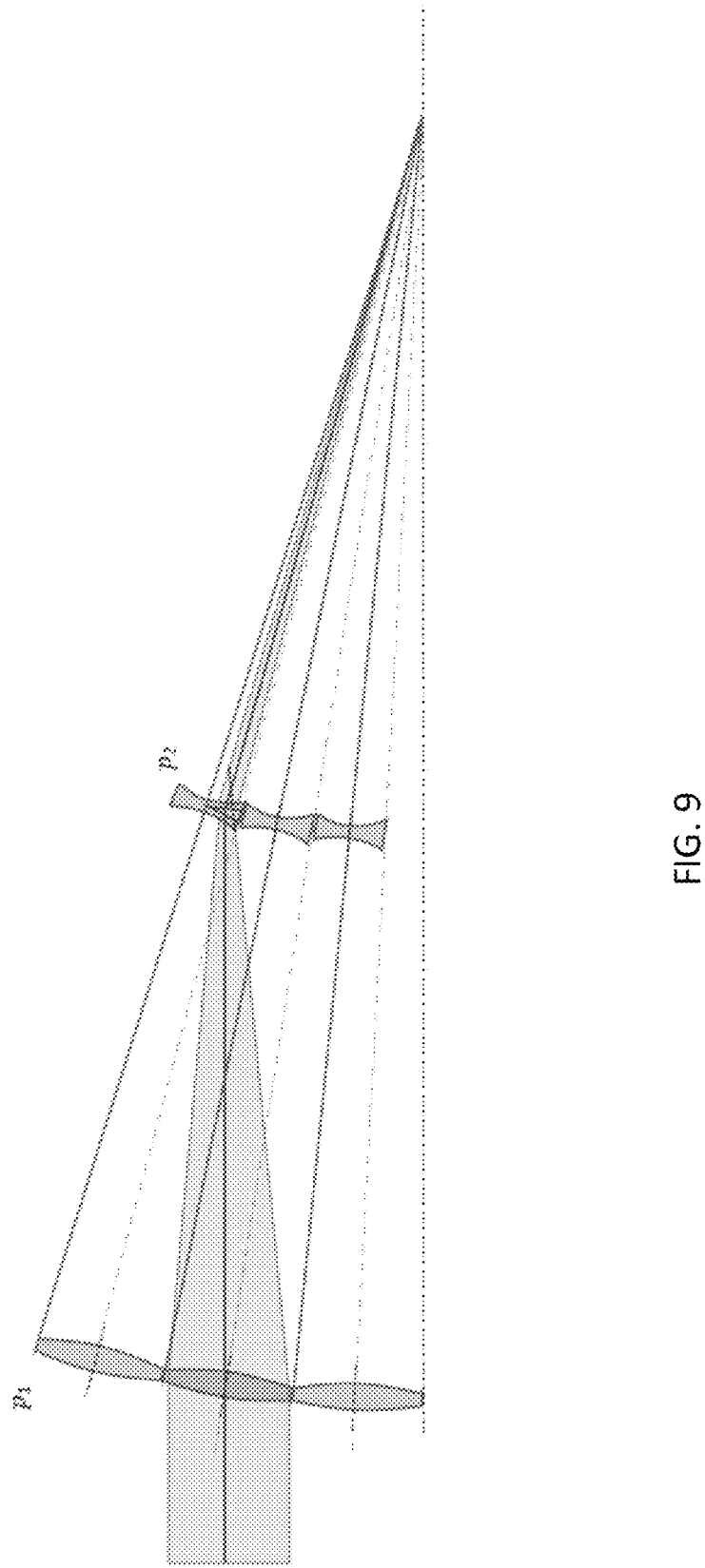
FIG. 9 is a diagram of light incident on first and second microlens arrays, according to a sixth embodiment.
Figure 10:
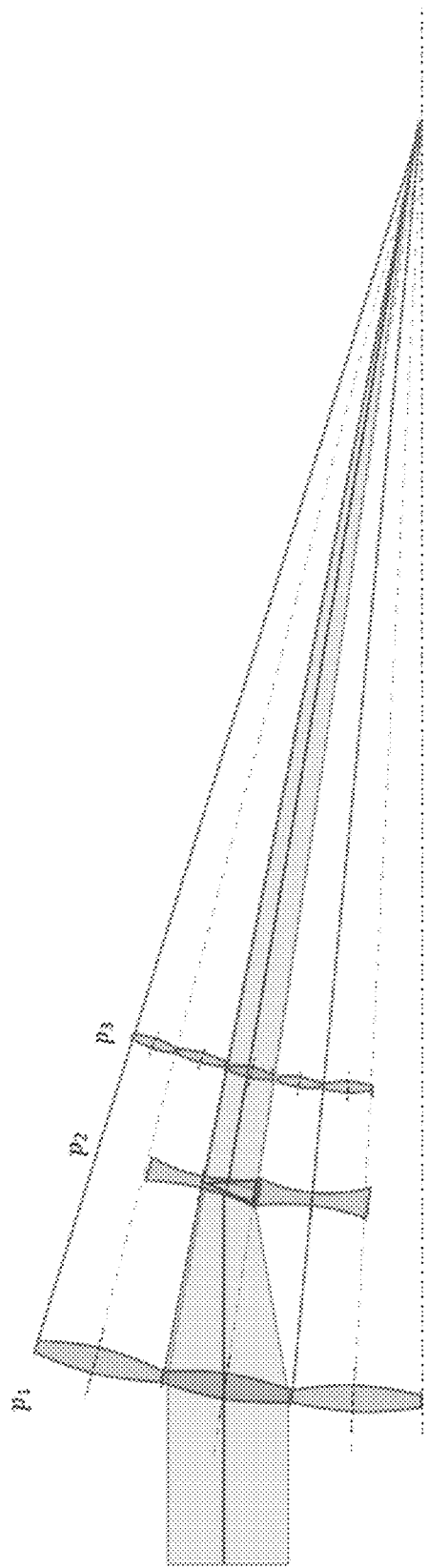
FIG. 10 is a diagram of light incident on first, second, and third microlens arrays, according to an embodiment.
Figure 11:
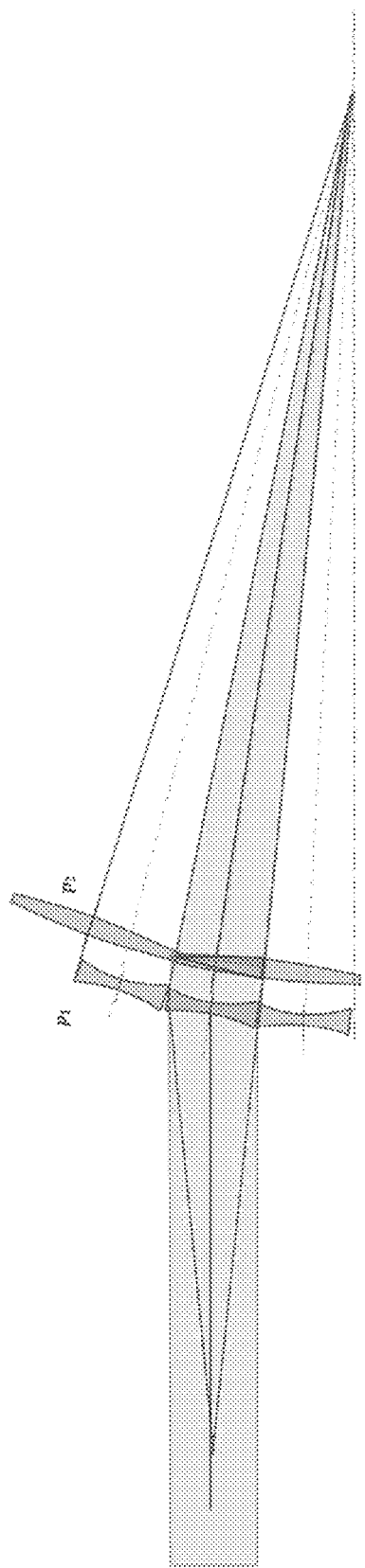
FIG. 11 is a diagram of light incident on first and second microlens arrays, according to a seventh embodiment.

FIG. 7 is the same as FIG. 6, but the pitch of the second microlens array of FIG. 7 now extends two channels. In FIG. 8, the focus of the first microlens can cross two channels for the center channel design—as long as the focus is on-axis to a corresponding microlens. In FIG. 9, the second array of FIG. 8 is made from negative lenses—as long as the back focal point of the first lens almost overlaps the front focal point of the back lens. In FIG. 10, an additional lens is added (to that shown in FIG. 6) which covers the area of the ray bundle. This element is used to compensate for aberrations, and/or spread the power and functionality of the first two lenses across three lenses. Finally, in FIG. 11, the first element is negative—as long as the wedge of one lens is used and the power is compensated in the other (commonly by nearly overlapping the focal points).

Figure 13:
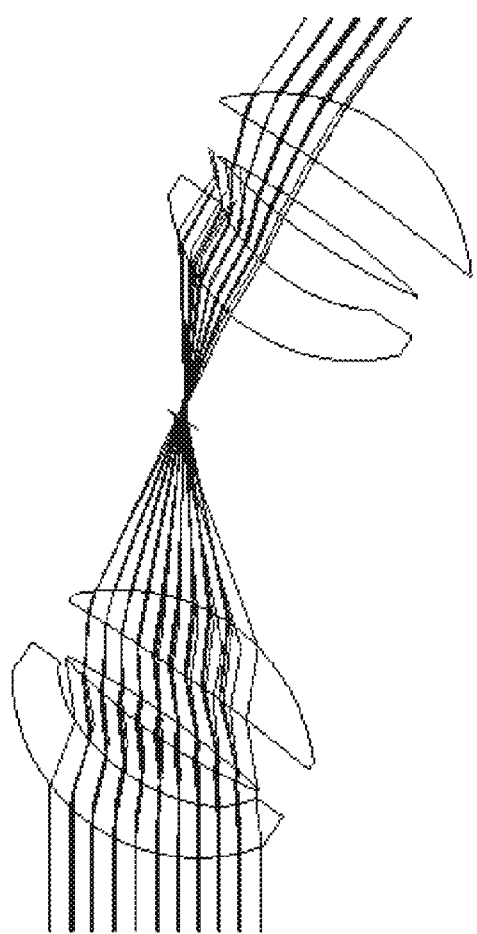
FIG. 13 is a diagram of the 35° Angle of Incidence set of two triplets for the two microlens arrays.

Two systems having the arrangement of microlens arrays shown in FIG. 4 were used to demonstrate the above offset lens designs. FIG. 12 shows a table with the prescription of a center channel designed for 35° Angle of Incidence, triplet per microlens array. The inner microlens array circle has a radius of 90 mm. The 0.35 mm offset corresponds to a half-channel angular offset. The microlens pitch is approximately 0.7 mm at 90 mm radius corresponding to 0.45° channels. FIG. 13 shows the 35° Angle of Incidence set of two triplets for the two microlens arrays.

Figure 14:
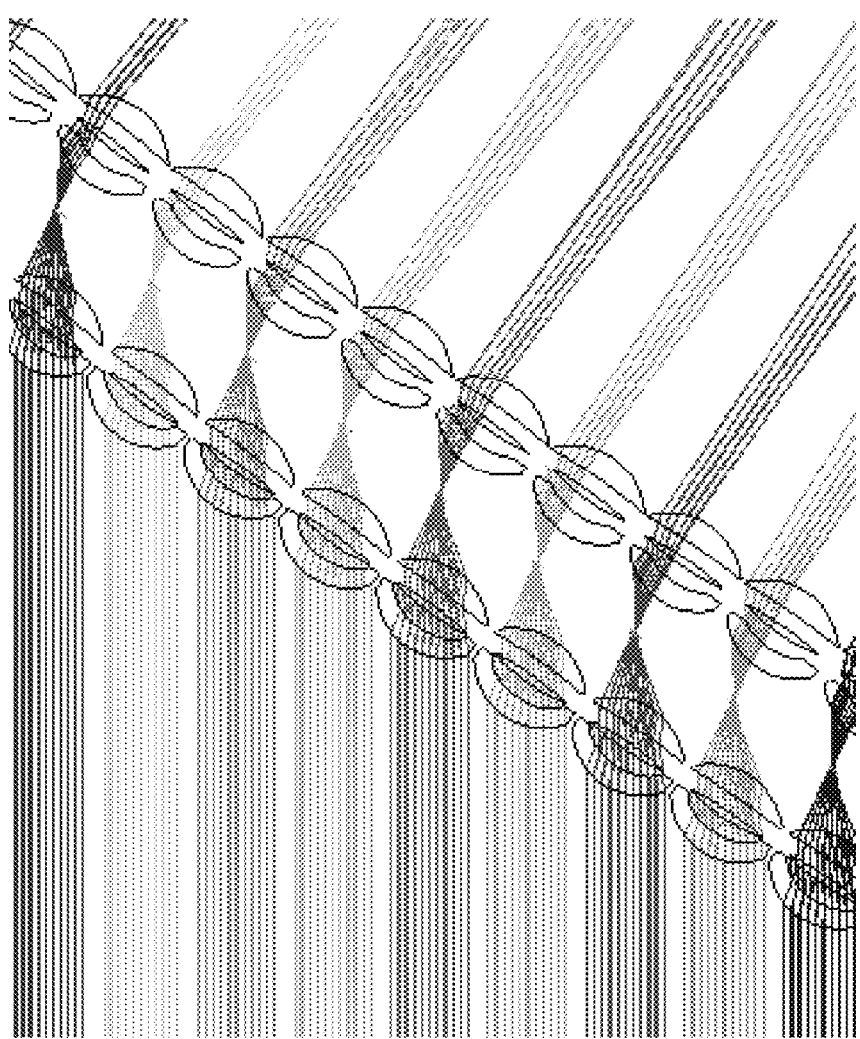
FIG. 14 is a zoomed perspective view of the microlens arrays spaced at 0.45° increments about the circle.
Figure 15:
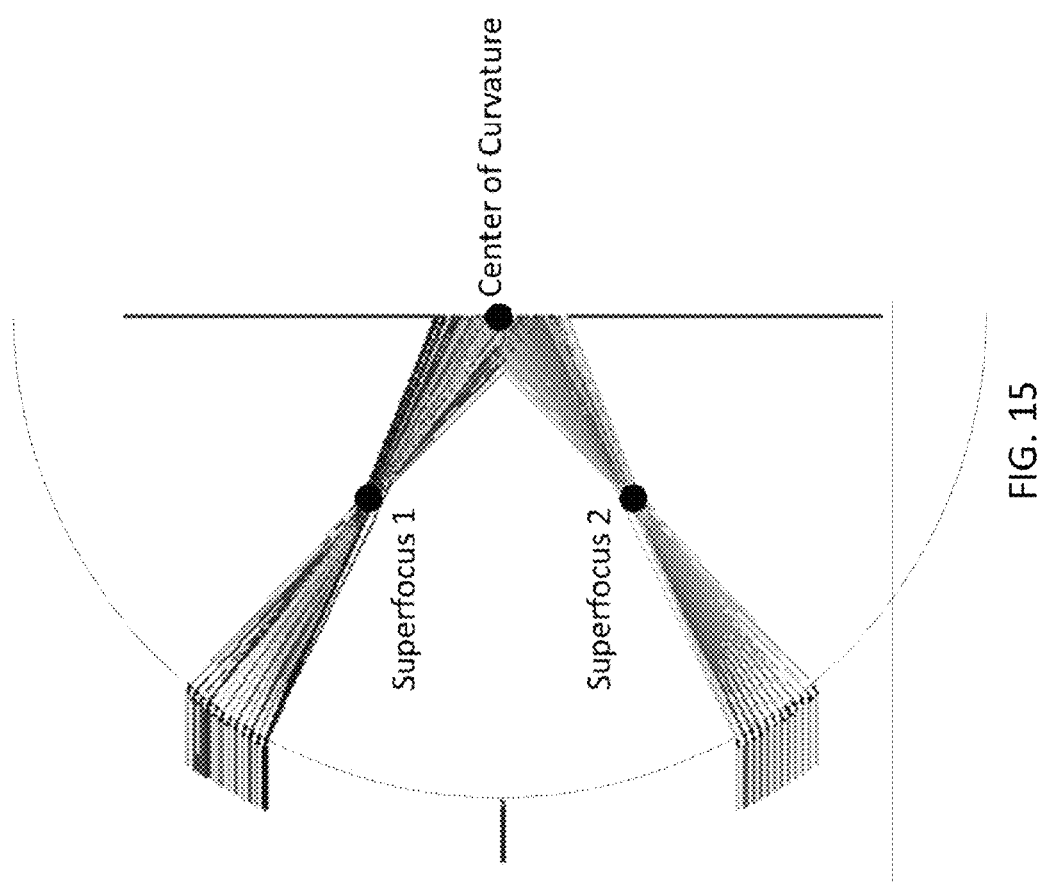
FIG. 15 is a diagram of a circle array having collimated rays incident thereon.
Figure 16:
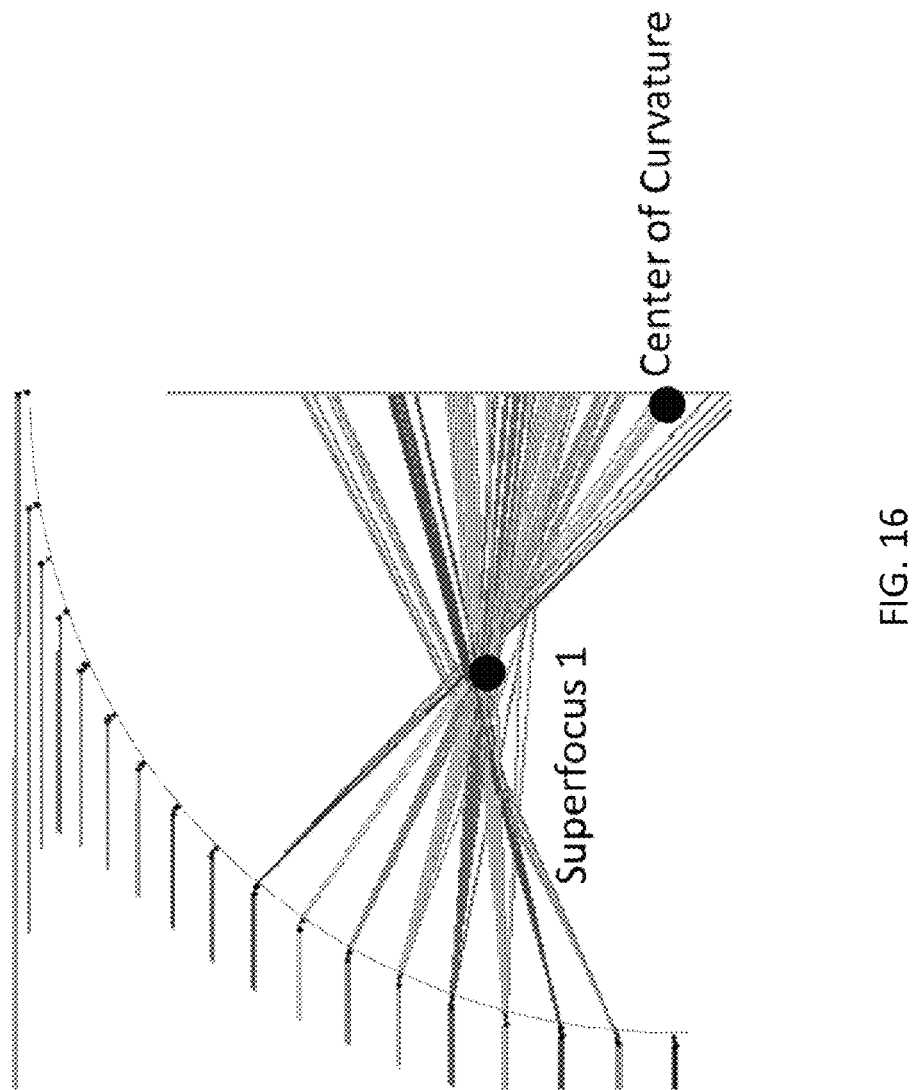
FIG. 16 is a diagram of lenses and rays spaced at 10° increments from 0° to 90° showing the extended collection area.

Turning now to FIG. 14, there is shown a zoomed perspective view of the microlens arrays spaced at 0.45° increments about the circle. Each microlens of each array is a triplet. FIG. 15 shows collimated rays incident on the circle array. The lenses are rendered for rays incident on the circle between 30° and 40° at 1° increments. A thin dotted line shows the inner radius of the second microlens array. Two superfoci appear, though collection is also significant to the center of curvature. A detector can be placed at the center of curvature of small radius, or larger radius such that the superfoci are on the surface of the detector. In FIG. 16, lenses and rays are spaced at 10° increments from 0° to 90° showing the extended collection area. A thin dotted line shows the inner radius of the second microlens array.

Figure 18:
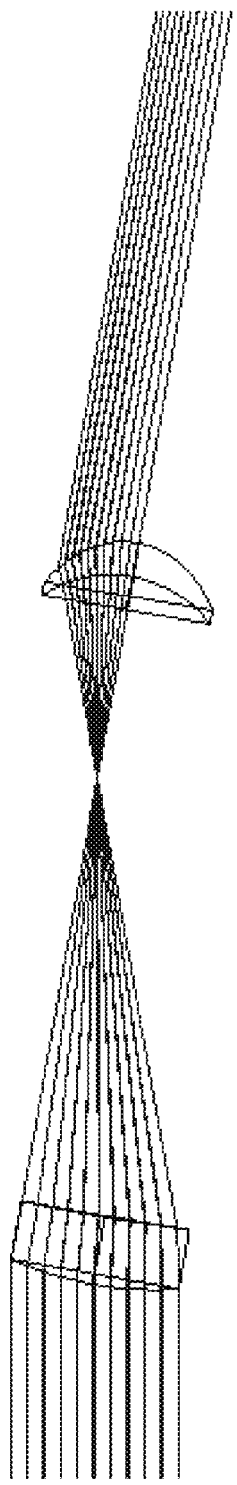
FIG. 18 is diagram of the 10° Angle of Incidence set of two singlets for the two microlens arrays.
Figure 19:
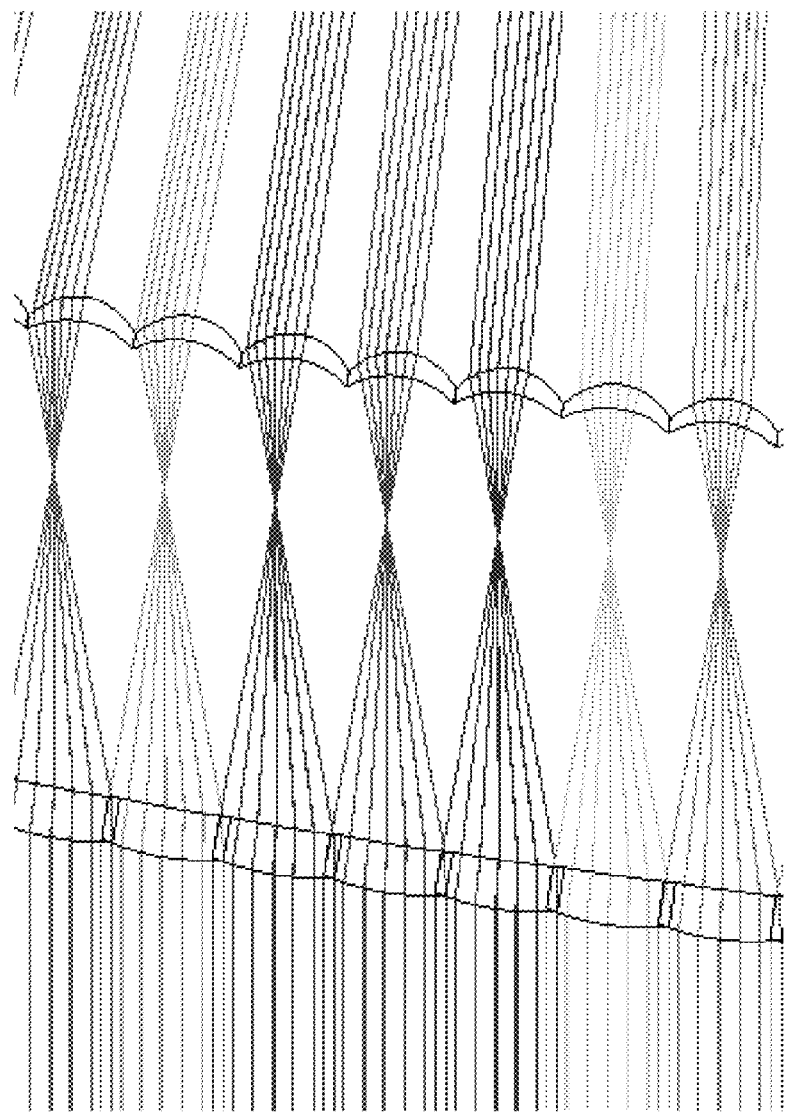
FIG. 19 is a zoomed perspective view of the microlens arrays spaced at 0.55° increments about the circle.
Figure 20:
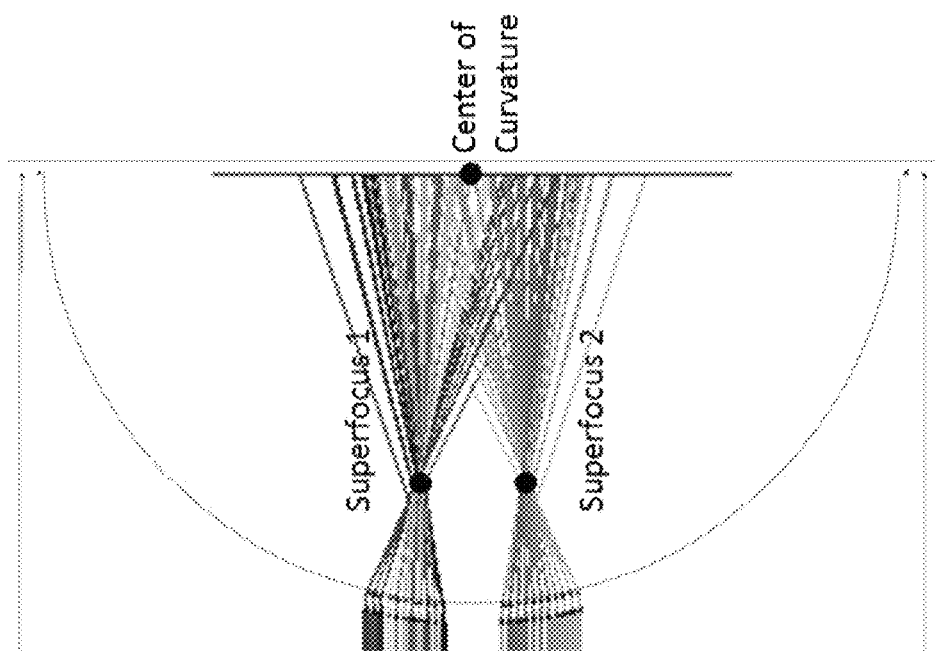
FIG. 20 is a diagram of a circle array having collimated rays incident thereon.

Referring now to FIG. 17, there is shown a table with the prescription of a center channel designed for 10° Angle of Incidence, singlet per microlens array. The inner microlens array circle has a radius of 100 mm. The 0.5 mm offset corresponds to a half-channel angular offset. The outer microlens array pitch is approximately 1 mm at 104 mm radius corresponding to 0.55° channels. FIG. 18 shows the 10° Angle of Incidence set of two singlets for the two microlens arrays. FIG. 19 shows a zoomed perspective of the microlens arrays spaced at 0.55° increments about the circle. FIG. 20 shows collimated rays incident on the circle array. The lenses are rendered for rays incident on the circle between 5° and 15° at 1° increments. A thin dotted line shows the inner radius of the second microlens array. Two superfoci appear, as shown in FIG. 20.

Figure 21:
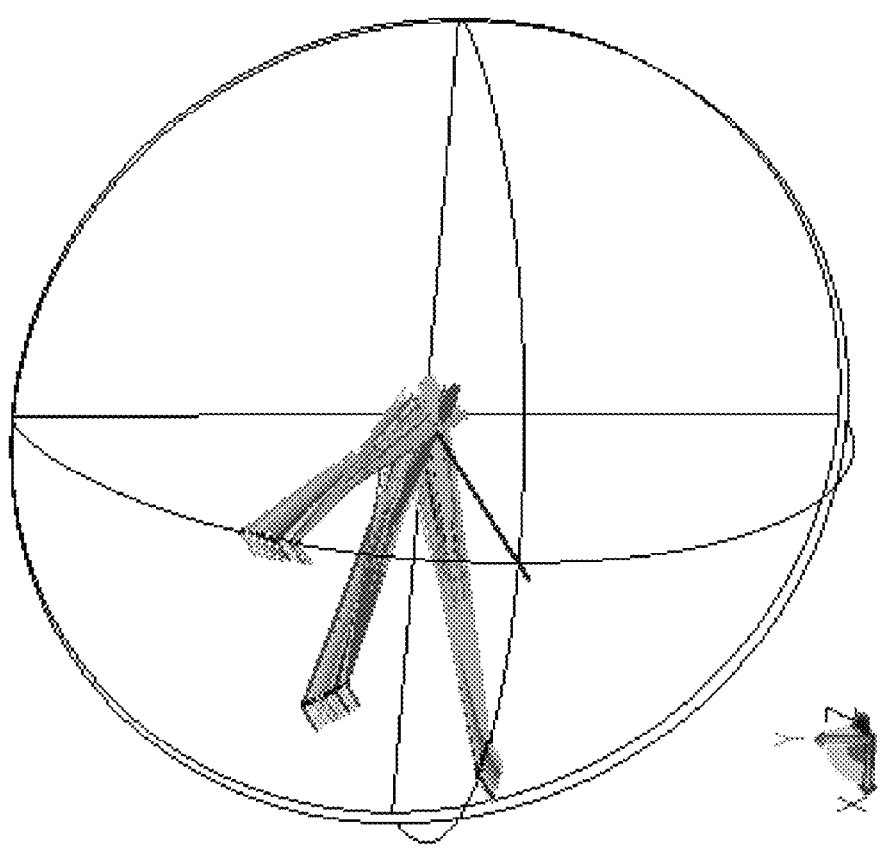
FIG. 21 is a diagram of the circle array of FIG. 15 rotated about the z-axis by 45° and 90°.
Figure 22:
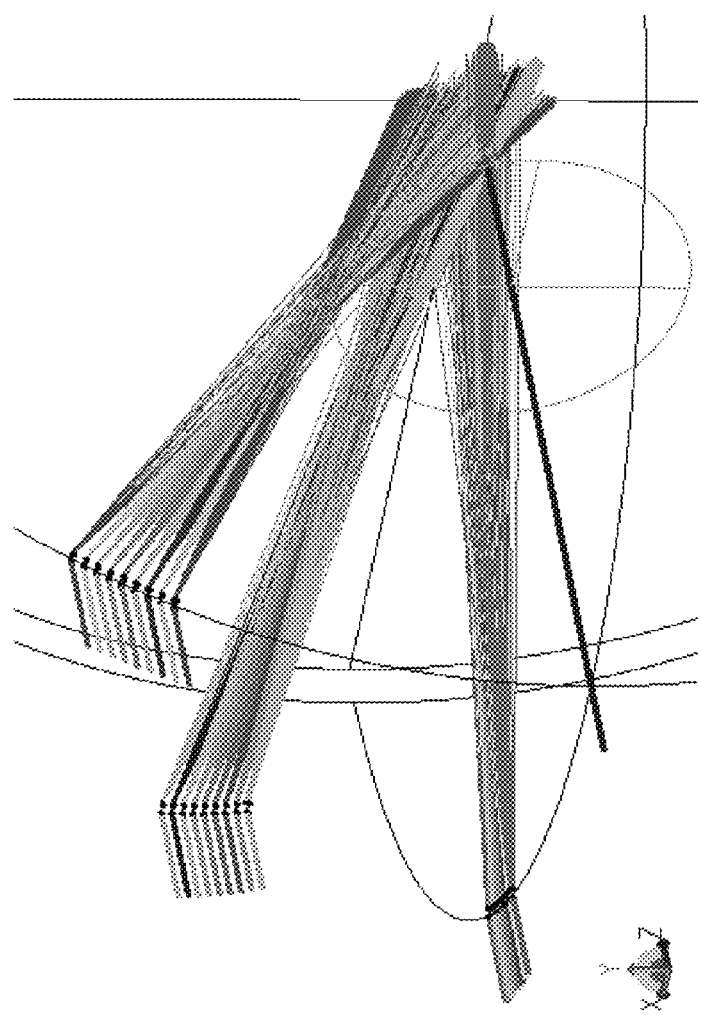
FIG. 22 is a zoomed view of FIG. 21 showing the ring of focus.
Figure 23:
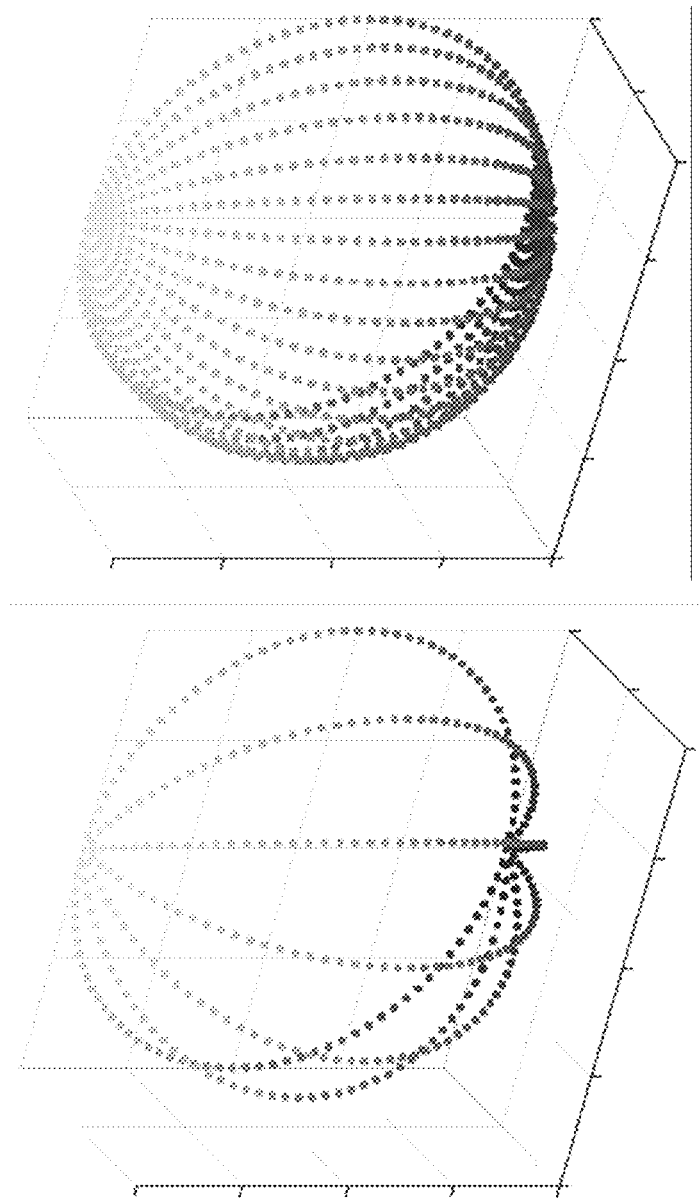
FIG. 23 shows graphs of points of a circle and the rotation of those points about a perpendicular axis.

FIGS. 21-23 shows lens positioning on a sphere for expansion to a 3D design (i.e., the base concept for spherical collection). FIG. 21 shows circle arrays focusing light to the center of curvature. The system of FIG. 15 is rotated about the z-axis by 45° and 90° to create FIG. 21, demonstrating the macro focusing effect. FIG. 22 shows the same system as FIG. 21, but depicting a ring of focus. It is comprised by the same superfocal points shown in FIG. 15, but rotated about the z-axis to form a circle.

The positions of microlenses for the 3D design are best described by a point cloud. The first issue is pitch spacing in different directions. For instance, if a circle of equi-distance points is rotated about an axis to create more points, there are different spacings in different directions between points at different locations on the sphere. This spacing issue is shown in FIG. 23. FIG. 23 illustrates that rotating points of a circle about a perpendicular axis is not sufficient to equally space lenses. Many algorithms can be used to determine the lens positions for relatively equally-spaced lenses. For instance, one computationally-efficient method was proposed by Jonathan Kogan in "A New Computationally Efficient Method for Spacing n Points on a Sphere," in the Rose-Hulman Undergraduate Mathematics Journal, Vol. 18, Iss. 2—as understood by one of ordinary skill in the art. The points are not perfectly equally spaced, but the error may be small enough depending on the channel design.

A second issue is the clocking or directionality of each channel. Another way to state the second issue is: if the lenses need to be offset, which direction do the lenses need to be offset in? Alternatively, where do the second microlenses need to be placed with respect to the first? A naïve, but sometimes effective, method takes the original relatively equally spaced points on a sphere, reduces the radii of the entire sphere of points, and rotates the entire sphere of points by approximately half the average angular spacing between channels.

Figure 24:
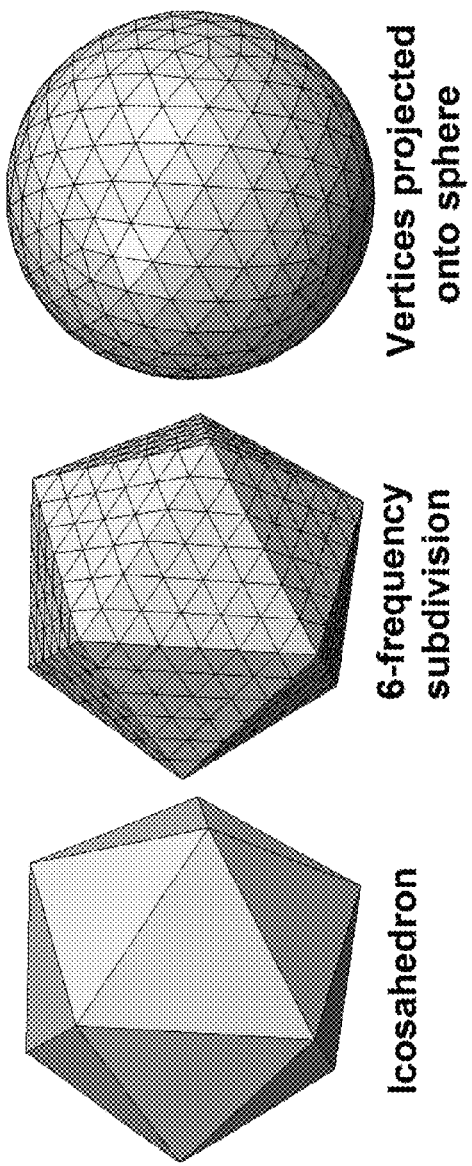
FIG. 24 is a diagram of triangle divisions on an icosahedron.

However, a superior method to determine both: (i) the channel locations (or locations of first microlens array elements), and (ii) the offset microlens array element locations is as follows. First, a base icosahedron is created. An icosahedron is a spherical polyhedron which has 12 points tangent to a circumscribed sphere. The 12 points form a 20-sided polyhedron, as shown in FIG. 24. Other spherical polyhedrons or geodesic polyhedrons can be used in this process to similar effect. Next, each of the 20 base triangles is iteratively split into more triangles, as shown in FIG. 24, by: (a) angularly bisecting each edge, where each 3-point base triangle becomes 6 points forming 4 minor triangles, then expanding all new points out to the circumscribed sphere, (b) angularly trisecting each edge and adding a point at the center of each triangle, where each 3-point base triangle becomes 10 points creating 9 minor triangles, then expanding all new points out to the circumscribed sphere, or (c) using another method to segment each base triangle into more triangles where all point are equi-angularly spaced across the triangle. While the points are not perfectly equi-angularly spaced about the entire sphere, the local spacing is more important in this system for ray bending than the global. The Rotationally Shift Invariant (RSI) system maintains sufficient segmented/discrete symmetry such that the entire sphere maintains similar light collection efficiency.

At the next step, overlapping points are deleted from tangent base triangles. All smallest minor triangles (from the last iteration) should have the same edge length on the circumscribed sphere. Finally, to create the offset locations, the point cloud is copied and the radius of the copied sphere of points is reduced by the amount necessary for the inner microlens array. For each of the 20 base triangles, all copied points are rotated half the height of the most minor triangle in the direction of one of the 3 base points of each triangle. Each rotated point should be, angularly, in the center of a previous minor triangle. This maintains the correct number of offset points (except at the edges of each base triangle, which can be corrected), and maintains symmetry of the system. The more splits that occur, the more equi-angularly spaced the points are.

Figure 25:
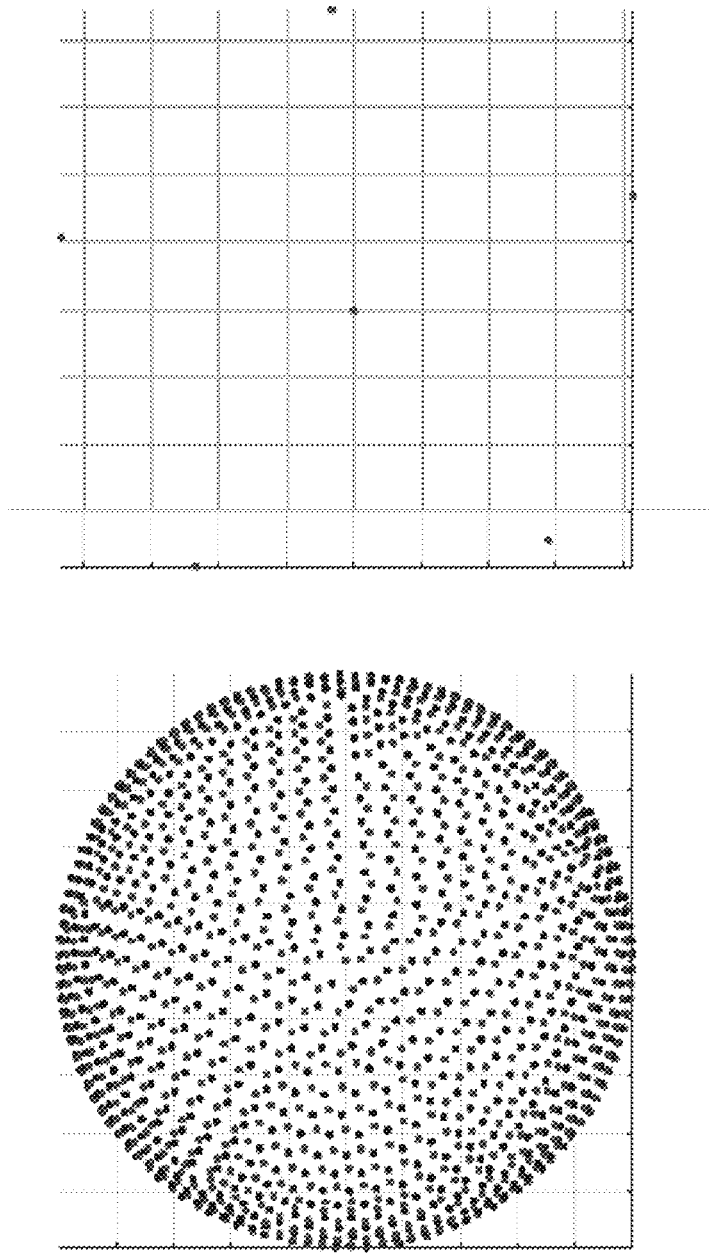
FIG. 25 shows graphs of the points from one trisection and two bisections of icosahedron triangles after removing −z points and offset points of the same.
Figure 26:
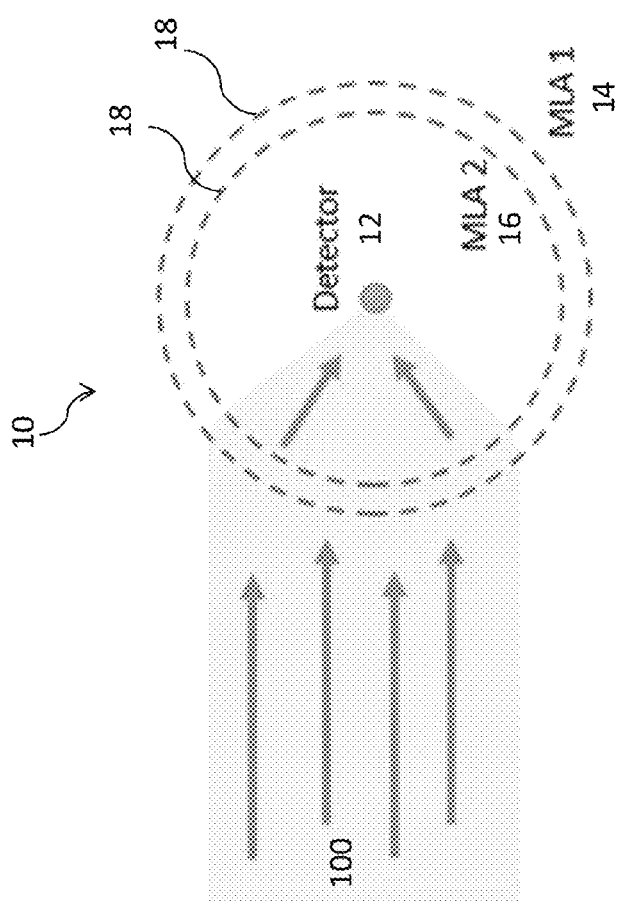
FIG. 26 is a diagram of an RSI system, according to an embodiment.

Depending on the channel design, the channels may be designed for highest light collection on the z-axis when the z-axis is oriented to be either normal to a base triangle surface of the original icosahedron or normal to a base point of the original isocahedron. Similarly, the base triangle may have a minor point at the center by using trisections or avoid a minor point at the center by avoiding trisections. Turning now to FIG. 25, there are shown, on the left, 723 points from one trisection and two bisections of icosahedron triangles, after removing −z points, and 723 offset points of the same. The discontinuity of the offsets shows the 20 base triangles. In FIG. 25, there are also shown, on the right, base points, after removing −z points, of the same base icosahedron. The points of FIG. 25 and FIG. 26 are on a sphere centered at the origin, and the projection of the 3D point clouds is on the x-y plane. Other geometrical layouts of the channels and offset microlenses can be used.

The resulting RSI system 10 is shown in FIG. 26. Specifically, FIG. 26 shows a diagrammatic view of light 100 incident onto the rotational shift invariant (RSI) system 10, according to an embodiment. The system 10 comprises a central detector 12 and two microlens arrays (MLA) 14, 16. In the depicted embodiment, the central detector 12 is at the center of curvature of the MLAs 14, 16. As shown in FIG. 26, light 100 is passed through both MLAs 14, 16 and is collected at the central detector 12. As also shown in the depicted embodiment, the central detector 12 comprises a radius which is smaller than the radius of both MLAs 14, 16.

Still referring to FIG. 26, the RSI system 10 uses concentric microlens arrays 14, 16 comprised of microlens elements or bulk optical elements 18. The preferred embodiment of the MLAs 14, 16 use glass lenses 18; however, other lens structures can be used for various and desired benefits. Other such lens structures (or bulk optical elements) 18 include: (a) single lens elements, comprised of a single lens; (b) multi-lens elements, comprised of multiple single lenses; (c) monolithic structure, where each MLA is made from a single spherical structure with bumps for each lens; (d) monolithic structure, where two MLAs are made from a single spherical structure with bumps on the outer surface are MLA 1 and bumps on the inner surface are MLA 2; (e) single element lenses are ball lenses; (f) metasurfaces and/or metalenses; (g) diffractive optical elements (DOEs); (h) magnetic lenses, e.g., for particle focusing; (i) Luneberg lenses; and (j) micro-structured surfaces.

As also shown in FIG. 26, the MLAs 14, 16 are aligned such that the physical structure, i.e., bulk optical elements 18, of the MLAs 14, 16 do not intersect. Stated differently, the MLAs 14, 16 are concentrically aligned. Although it is possible, this does not necessarily mean that the bulk optical elements 18 of the first MLA 14 are aligned with the bulk optical elements 18 of the second MLA 16. Further, and most importantly, alignment of the MLAs 14, 16 does not necessarily mean that the optical axes of the MLAs 14, 16 are aligned. In fact, in the preferred embodiment, the optical axes of the MLAs 14, 16 are offset. Examples of MLAs having offset optical axes are shown in FIGS. 4-11.

Figure 27:
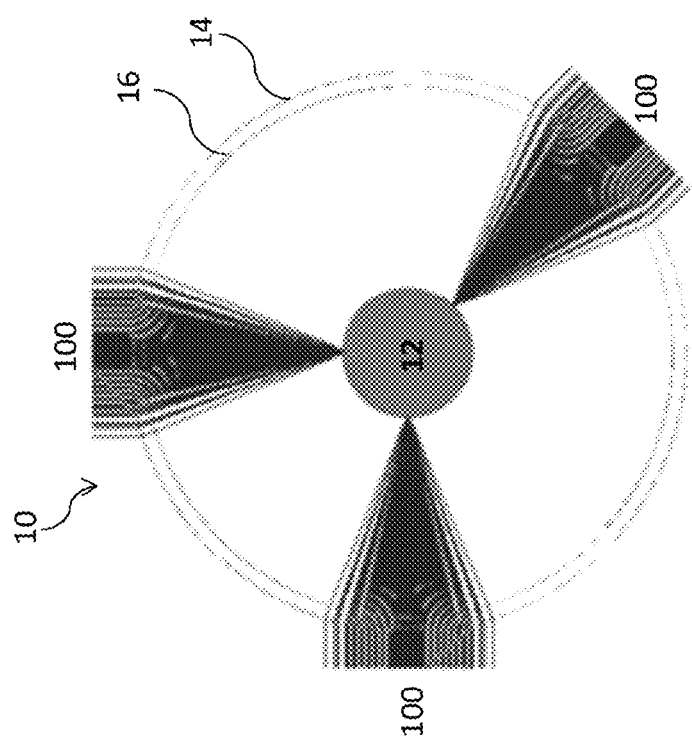
FIG. 27 is a diagram of the RSI system, according to an alternative embodiment.

Turning now to FIG. 27, there is shown a diagrammatic view of light 100 incident on a rotational shift invariant (RSI) system 10, according to an alternative embodiment. In the depicted embodiment, the central detector 12 has a radius larger than the radius of the embodiment of the central detector 12 in FIG. 26. In the embodiment in FIG. 27, the central detector 12 collects light 100 equivalently from multiple directions.

In other embodiments, the central detector 12 is a detector array. When the central detector 12 is a detector array, all array elements contribute to the same signal or each array element is an independent channel. If a detector array is used as the central detector 12 in the RSI system 10 in FIG. 27 with independent channels, each channel of the detector array would alert the system 10 to a direction-dependent signal across the 360-degree or 4-pi FOV. However, the RSI system 10 is not limited only to 360-degree or 4-pi systems. For instance, the same design technique could be used for a 270-degree system. The same design technique could also be used for a 60-degree fOV system with an effective collection area beyond the capability of a typical (F/#-limited) camera lens.

Figure 28:
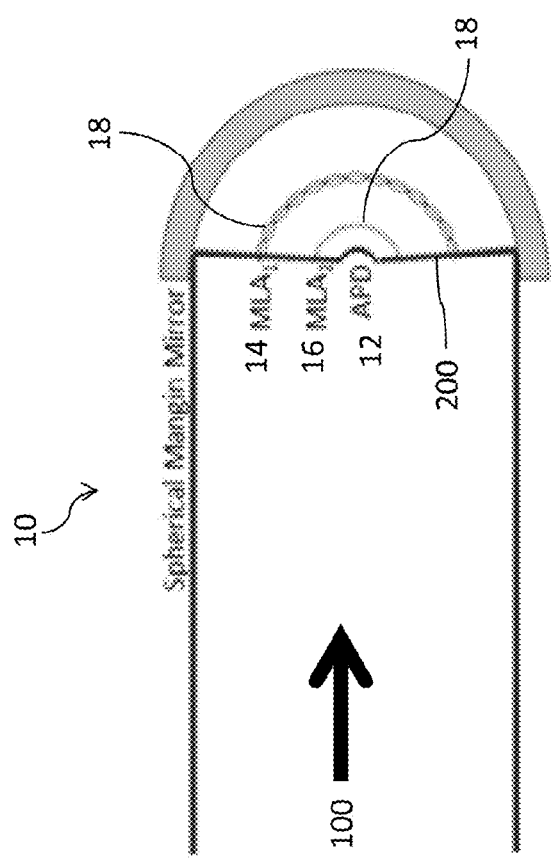
FIG. 28 is a diagram of the RSI system with a Mangin mirror, according to an embodiment.

Additionally, the RSI system 10 described above can be combined into other optical systems, often by not using a complete sphere of microlenses. For instance, a partial sphere can be used with a Mangin mirror 200 to achieve higher collection across a select FOV, as shown in FIG. 28. Specifically, FIG. 28 shows a two microlens array design, a Mangin mirror 200 combined with a partial sphere. In the depicted embodiment, the Mangin mirror 200 is positioned between the light source (and incident light) 100 and the MLAs 14, 16.

All definitions, as defined and used herein, should be understood to control over dictionary definitions, definitions in documents incorporated by reference, and/or ordinary meanings of the defined terms.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as, "has" and "having"), "include" (and any form of include, such as "includes" and "including"), and "contain" (any form of contain, such as "contains" and "containing") are open-ended linking verbs. As a result, a method or device that "comprises", "has", "includes" or "contains" one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts and equivalents of all means or step plus function elements in the claims below, if any, are intended to include any structure, material or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A light collection system, comprising:
    a first set of one or more microlens array shell structures each having a first array of microlenses, each of the microlens arrays having multi-axis concentrically arranged microlenses that are radially arranged with respect to a center of curvature of the first set;
    a second set of one or more microlens array shell structures each having a second array of microlenses, each of the microlens arrays having multi-axis concentrically arranged microlenses that are radially arranged with respect to a center of curvature of the second set, the second set aligned with the first set and the microlenses in the first microlens array and the microlenses in the second microlens array being arranged with respect to one another to thereby define a plurality of radially arranged optical channels between the first set and the second set;
    wherein microlenses in the second microlens array capture light from the microlenses in the first microlens array from a $4\pi$ steradian field of view and direct the light towards a central location so that the light traverses at least two of the optical channels while advancing towards the central location; and
    a light source directed at the one or more microlens array shell structures.

2. The system of claim 1, further comprising a Mangin mirror positioned between the light source and the first and second sets.

3. The system of claim 1, wherein the second set is within the first set.

4. The system of claim 3, further comprising a central detector within the second set.

5. The system of claim 4, wherein the central detector is a detector array.

6. A rotationally shift invariant system, comprising:
    a first spherical structure of a plurality of microlens arrays having one or more microlens elements that are arranged in a multi-axis concentric manner;
    a second spherical structure of a plurality of microlens arrays concentrically within the first spherical structure having one or more microlens elements that are arranged in a multi-axis concentric manner, the microlens elements in the first spherical structure and the microlens elements in the second spherical structure being arranged with respect to one another to thereby define a plurality of radially arranged optical channels between the first and second spherical structures;
    a detector substantially centrally located within the first spherical structure; and
    wherein a center of curvature of both the first and second spherical structures is at the detector, and further wherein the microlens elements in the second spherical structure capture light from the microlens elements in the first set of the one or more microlens array shell structures from a $4\pi$ steradian field of view and directs the light towards the detector so that the light traverses at least two of the optical channels while advancing towards the detector.

7. The system of claim 6, further comprising a light source directed toward at least one of the first and second spherical structures.

8. The system of claim 7, wherein the detector collects light from the light source equivalently at the detector.

9. The system of claim 6, wherein the detector is a detector array.

10. The system of claim 6, wherein the first and second spherical structures each have a radius.

11. The system of claim 6, wherein a radius of the detector is smaller than the first and second spherical structures.

12. The system of claim 1, wherein the microlens elements are at least one of: a single lens, a plurality of single lenses, ball lenses, metalenses, diffractive optical elements, and magnetic lenses.

13. A method for light collection, comprising the steps of:
    providing a light collection system having a light source, a first set of one or more microlens array shell structures each having a first focal point and a first array of microlenses, and a second set of one or more microlens array shell structures having a second array of microlenses, wherein the first and second sets of one or more microlens array shell structures have multi-axis concentrically arranged bulk optical components, microlenses in the first microlens array and microlenses in the second microlens array being arranged with respect to one another to thereby define a plurality of radially arranged optical channels between the first set and the second set;

wherein the first set and the second set of one or more microlens array shell structures have a pitch offset; and focusing light from the light source at each of the first focal points, wherein the bulk optical components in the second set of the one or more microlens array shell structures capture light from the bulk optical components in the first set of the one or more microlens array shell structures from a $4\pi$ steradian field of view and directs the light towards a central location so that the light traverses at least two of the optical channels while advancing towards the central location.

14. The method of claim 13, wherein each of the first focal points are at a central detector.

15. The method of claim 14, further comprising the step of collecting the light from the light source at the central detector.

16. The method of claim 13, wherein the microlenses comprise at least one of: Luneburg lenses, micro-structured surfaces, a single lens, a plurality of single lenses, ball lenses, metalenses, diffractive optical elements, and magnetic lenses.

17. The method of claim 13, wherein the second set of one or more microlens array shell structures is aligned with the first set of one or more microlens array shell structures and the second set of one or more microlens array shell structures is concentrically within the first set of one or more microlens array shell structures.

* * * * *